United States Patent [19]

Kaneko et al.

[11] Patent Number: 5,534,786
[45] Date of Patent: Jul. 9, 1996

[54] BURN-IN AND TEST METHOD OF SEMICONDUCTOR WAFERS AND BURN-IN BOARDS FOR USE IN SEMICONDUCTOR WAFER BURN-IN TESTS

[75] Inventors: Kazuo Kaneko, Kawasaki; Masayasu Katayama, Yokohama; Kiyoshi Kochi, Sagamihara, all of Japan

[73] Assignee: Co-Operative Facility For Aging Tester Development, Kawasaki, Japan

[21] Appl. No.: 392,428

[22] Filed: Feb. 22, 1995

[30] Foreign Application Priority Data

Oct. 14, 1994 [JP] Japan ................................ 6-249048

[51] Int. Cl.⁶ .................................................. G01R 31/28
[52] U.S. Cl. ............................................ 324/760; 324/765
[58] Field of Search ........................... 324/158.1, 73.1, 324/765, 764, 755, 760; 371/15.1, 22.2, 22.1, 29.1; 437/8; 251/40, 48; 29/705, 244, 739

[56] References Cited

U.S. PATENT DOCUMENTS

| | | | |
|---|---|---|---|
| 4,902,969 | 2/1990 | Gussman | 324/760 |
| 5,003,251 | 3/1991 | Fuoco | 324/764 |
| 5,012,187 | 4/1991 | Littlebury | 324/765 |
| 5,021,733 | 6/1991 | Ebihara et al. | 324/760 |
| 5,289,113 | 2/1994 | Meaney et al. | 324/73.1 |
| 5,414,370 | 5/1995 | Hashinaga et al. | 324/760 |

*Primary Examiner*—Vinh P. Nguyen
*Attorney, Agent, or Firm*—Keck, Mahin & Cate

[57] ABSTRACT

Disclosed is an improved burn-in and test method of semiconductor wafers each having numerous integrated circuits formed therein. It includes the steps of dividing each semiconductor wafer into blocks each including some integrated circuits; giving each block an address to indicate in which part of the semiconductor wafer the integrated circuits of the block are placed; recording the addresses of all blocks; preparing burn-in boards each having sockets to detachably hold carriers each bearing an identification code; loading each carrier with a block to be tested; fitting each carrier in a selected socket in the burn-in board; and carrying out the burn-in and required tests on the blocks of each burn-in board. Analysis of test results permits the locating of defective integrated circuits, if any in semiconductor wafers in terms of the recorded addresses of the blocks and the identification codes of the carriers.

2 Claims, 4 Drawing Sheets

5,534,786

BURN-IN AND TEST METHOD OF SEMICONDUCTOR WAFERS AND BURN-IN BOARDS FOR USE IN SEMICONDUCTOR WAFER BURN-IN TESTS

BACKGROUND OF THE INVENTION

1. Field of the Invention

The present invention relates to a burn-in and test Method of semiconductor wafers and burn-in boards for use in semiconductor wafer burn-in tests.

2. Description of Prior Arts

Memories, logic circuits and other devices use integrated circuits, and such integrated circuits are produced according to the photo-printing and etching processes, which processes are effected on silicon wafers to form a lot of semiconductor integrated circuits thereon. Then, such silicon wafers are diced to separate the so formed integrated circuits, and finally each and every integrated circuit is packaged. Usually three to four hundred integrated circuits are formed in a single wafer.

A prober-and-tester is used to check all integrated circuits of the silicon wafer one by one, and mark defective integrated circuits with ink, if any, and the so marked integrated circuits are rejected and disposed. At this stage those integrated circuits which have passed the test are separated from each other by dicing the wafer, and connection pins are bonded to the terminals of each silicon chip of integrated circuit. Finally the semiconductor chip is packaged by molding to provide an integrated circuit unit.

The integrated circuit units thus made are subjected to aging prior to marketing. This is necessitated because a large number of the integrated circuit units which have passed required tests are liable to have malfunctions or defects after 1000 hour-long working. Aging has the effect of eliminating such initial malfunctions. Aging is carried out by keeping integrated circuit units at a relatively high temperature (125 degrees Celsius) and by applying a dc voltage thereto for about 100 hours. After aging the integrated circuit units are subjected to a final test, and then the integrated circuit units which have passed the final test can be marketed.

A large number of integrated circuit units, however, are rejected at the final stage after aging, and are disposed. These rejected integrated circuit units have passed required preceding tests, and have passed the bonding, molding and packaging stages, and therefore, disposal of such integrated circuit units is waste of time, labor and expense involved for such preceding stages.

From the angle of saving the preceding treatments vainly performed on integrated circuit units which are finally rejected as defective it is supposed to be advantageous that: silicon wafers each having a lot of integrated circuits formed thereon are subjected to aging process; the so aged silicon wafers are tested by a prober-and-tester to determine which integrated circuits are permissible; the integrated circuits thus found to be permissible are separated by dicing; and finally connection pins are bonded to the terminals of each of the semiconductor chips, and then, all semiconductor chips are packaged to provide integrated circuit units. Also, from the same point of view as mentioned above it is supposed to be advantageous that: "bare" semiconductor chips prior to bonding and packaging are subjected to aging; the so aged, "bare" chips are tested by a prober-and-tester to determine which chips are permissible; and the "bare" chips which passed required tests are subjected to subsequent treatments such as bonding and packaging to provide final products.

As for the former the aging at an early stage necessitates the applying of a required dc voltage to the terminals of each integrated circuit formed in a silicon wafer, for instance by using a wafer prober-and-tester, but the "one-by-one" aging of three to four hundred integrated circuits in the wafer involves much time and labor, and therefore, it is almost impractical.

Incidentally, to meet the demand for the simultaneous aging and testing of numerous integrated circuits in a silicon wafer there has been developed and used a wafer burn-in apparatus which can effect every kind of aging and monitored aging on all integrated circuits in the silicon wafer in a relatively short time, thus permitting a substantial reduction of manufacturing cost for integrated circuits. Also, the aging and testing of integrated circuits prior to dicing permits the rejecting of defective integrated circuits while remaining in the wafer, thus saving required bondings and packagings for integrated circuits which otherwise would be found defective at the final stage after dicing and completing such bondings and packagings.

Such a wafer burn-in apparatus, however, is very complicated because it is designed to use a plurality of printed contact boards in selectively accessing to the bonding pads or terminals each of the numerous integrated circuits formed in the silicon wafer.

The number of bonding pads increases with the increase of the integrated circuits to be formed in the silicon wafer, and accordingly the number of printed contact boards increases, and the contact-to-terminal alignment will be increasingly difficult. Thus, the number of integrated circuits to be formed in a single silicon wafer is limited by the permissible density at which the contacts of the printed contact board are formed so as to be put in contact with the bonding pads each of the integrated circuits in the silicon wafer. Stated otherwise, the wafer burn-in apparatus cannot handle semiconductor wafers each having too many integrated circuits to connect to the wafer burn-in system via the contacts of the associated printed contact boards.

As for the aging of "bare" chips described above there has been developed and used another burn-in apparatus which can effect required function tests, burn-ins, selections and other treatments in the same circumference as packaged chips are subjected to such required treatments.

It uses chip carriers and sockets to accommodate and detachably hold such chip carriers. Each carrier can be loaded with a "bare" chip. The carrier has a self-alignment capability of automatically putting the bonding pads of the "bare" chip in contact with the terminals of the carrier, and when the carrier is put in the socket, the "bare" chip can be connected to the burn-in apparatus.

Advantageously this type of burn-in apparatus requires much less complicated electric connections than the burn-in apparatus for the simultaneous aging and testing of numerous integrated circuits in a silicon wafer. It, however, requires that numerous carriers are loaded with "bare" chips one after another, and this loading work involves much time.

Also, disadvantageously the burn-in apparatus has no means to determine which parts of the original wafer correspond to individual "bare" chips. From the results of the burn-in test, therefore, nobody can tell which part of the silicon wafer is liable to cause what kind of defect.

SUMMARY OF THE INVENTION

One object of the present invention is to provide a burn-in and test method of semiconductor wafers each having a lot of integrated circuits formed therein, which method is free of loading carriers with "bare" chips one by one, and permits the locating of defective "bare" chips in the original wafer, thus making full use of the test results to determine which parts of the wafer are liable to cause what kind of defect.

Another object of the present invention is to provide a burn-in board for use in such burn-in test of semiconductor wafers.

To attain these objects a burn-in and test method of semiconductor wafers each having a lot of integrated circuits formed therein is improved according to the present invention in that it comprises the steps of: dividing a semiconductor wafer into a plurality of blocks to be tested, each block including at least two bare; dies assigning positional information to indicate in which part of the semiconductor wafer the bare dies of each block are placed and recording the positional information; preparing a burn-in board having a plurality of sockets to detachably hold carriers and loading each carrier with one of the blocks to be tested; fitting each carrier in a selected socket in the burn-in boards and carrying out the burn-in test on the blocks in the burn-in board; and determining a defective part of the semiconductor wafer which includes at least one defective bare die based on the positional information of the blocks as a result of the burn-in test.

The step of recording the positional information of each block may include putting a visible indication on each block to be tested.

Each carrier may have an identification code noticeable to the eye or accessible or readable electrically.

A burn-in board for use in burn-ins and tests of semiconductor wafers each having a lot of integrated circuits formed therein is improved according to the present invention in that it comprises: a printed contact board comprising an arrangement of sockets each having a plurality of contacts, a plurality of terminals to permit the connecting of the printed contact board to a burn-in test apparatus, and a printed conductor pattern connecting the terminals to the corresponding contacts of the sockets; and a plurality of carriers to be detachably fit in the sockets, each carrier having an identification code thereon, and carrying a block having some integrated circuits formed therein, which block is separated from the semiconductor wafer to be checked.

BRIEF DESCRIPTION OF THE DRAWINGS

Other objects and advantages of the present invention will be understood from the following description of preferred embodiments of the present invention, which are shown in accompanying drawings.

Figure 1:
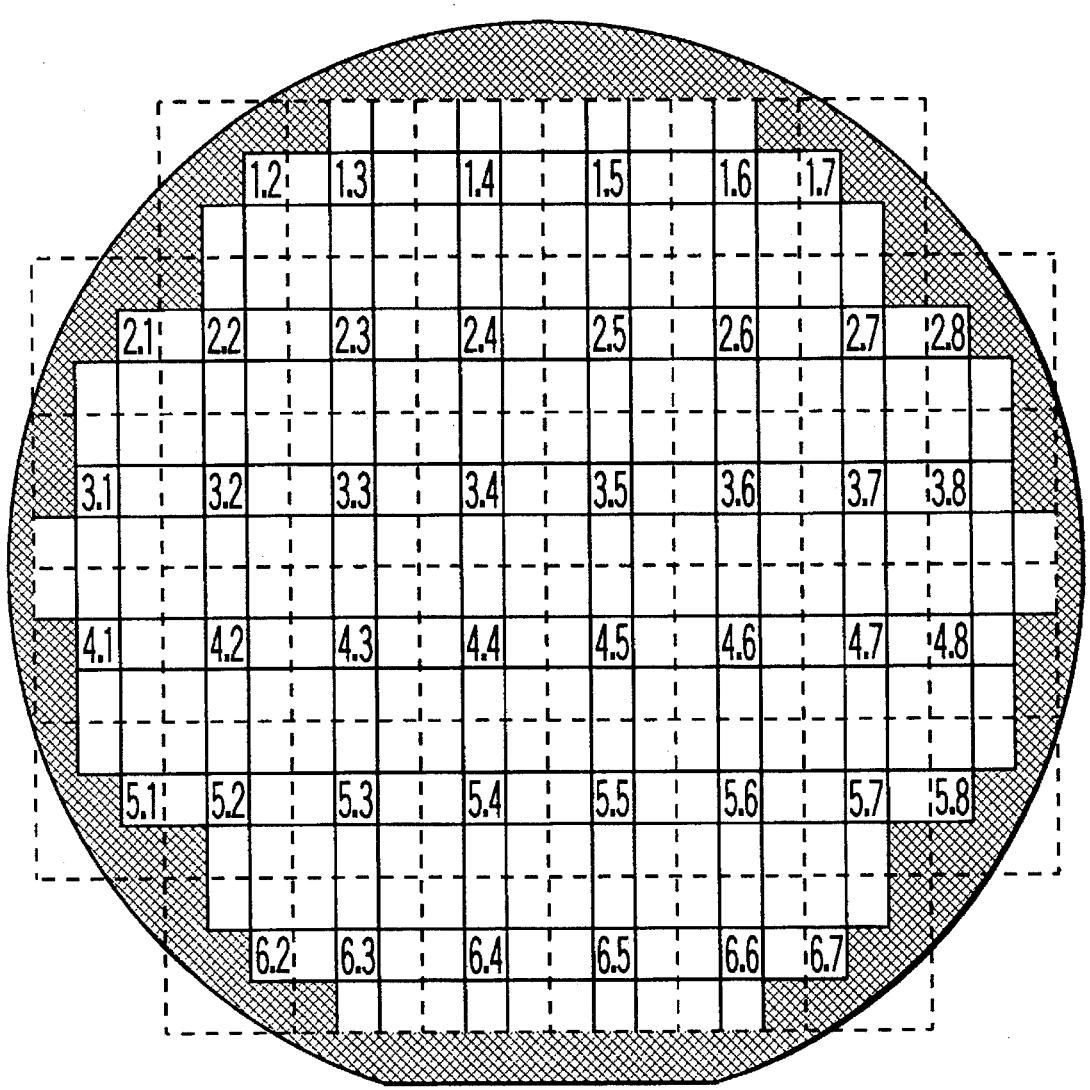
FIG. 1 is a plan view of a semiconductor wafer, showing how it is diced to separate blocks to be tested.
Figure 2:
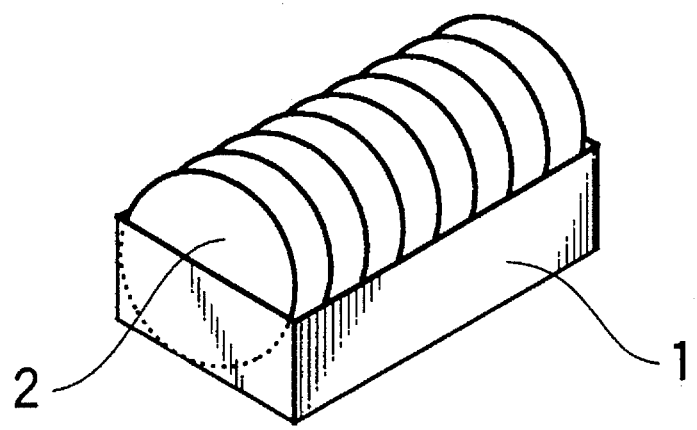
FIG. 2 is a perspective view of semiconductor wafers in a cassette.
Figure 3:
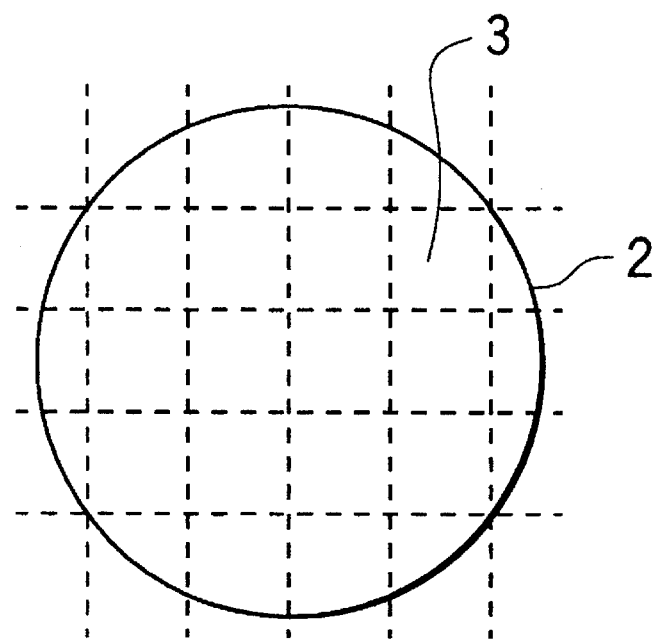
FIG. 3 shows how a single semiconductor wafer is diced to blocks.

DESCRIPTION OF PREFERRED EMBODIMENTS:

In a burn-in and test method according to the present invention, first a semiconductor wafer having a lot of integrated circuits formed therein is divided into a plurality of blocks to be checked, each block containing some integrated circuits, and an address, positional information or place-identification number is given to each block to indicate in which part of the semiconductor wafer the integrated circuits of the block are placed, and the address of the block is recorded. FIG. 1 shows one example of such semiconductor wafer having divisional blocks each bearing its address.

Specifically a five-inch wafer has 5.00 mm×5.80 mm large dies (integrated circuits) formed therein. The marginal waste portion of the wafer is indicated by cross-hatching. Dies are indicated to be bounded by solid lines whereas blocks are indicated to be bounded by broken lines. The wafer is diced along the broken lines to 44 blocks to be checked. As seen from FIG. 1, almost all blocks contain 9 dies, and each block is given an address or block number to indicate in which part of the original wafer the dies of the block are positioned. Such address is preferably noticeable to the eye, but it may be stored in a computer memory in the form of a carrier-to-block identification correspondence table, thereby permitting identification of blocks in terms of carrier identification codes.

Referring to FIGS. 2 to 5, the manner in which required dicing, burn-in and test are effected is described below. As seen from FIG. 2, a batch of wafers 2 are put in a casette 1, and then these wafers 2 are rinsed in water. Each wafer is diced along the broken lines as seen from FIG. 3, thus separating into a number of blocks 3 to be checked, and each block contains 9 (=3×3) dies.

Figure 4:
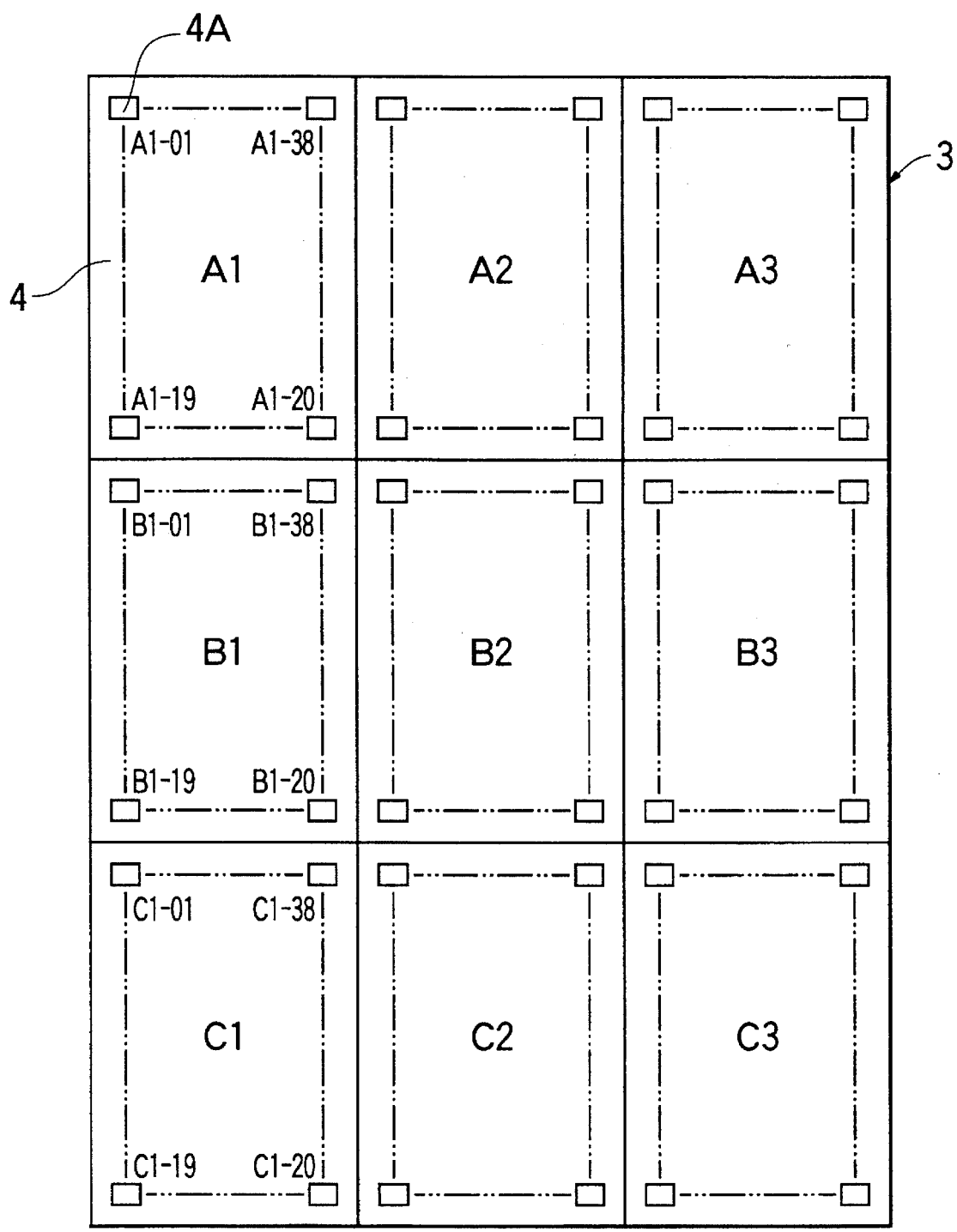
FIG. 4 is an enlarged plane view of a single block.

FIG. 4 shows a single block 3 to be checked in an enlarged size. It contains nine dies 4 each marked with A1, A2, A3, B1, B2, B3, C1, C2 and C3. Each dice 4 has a plurality of pads, as for instance Dice A1 has pads each marked with A1-01, A1-02, A1-03, . . . A1-38. The block 3 has a block number or address as seen from FIG. 1.

Figure 5:
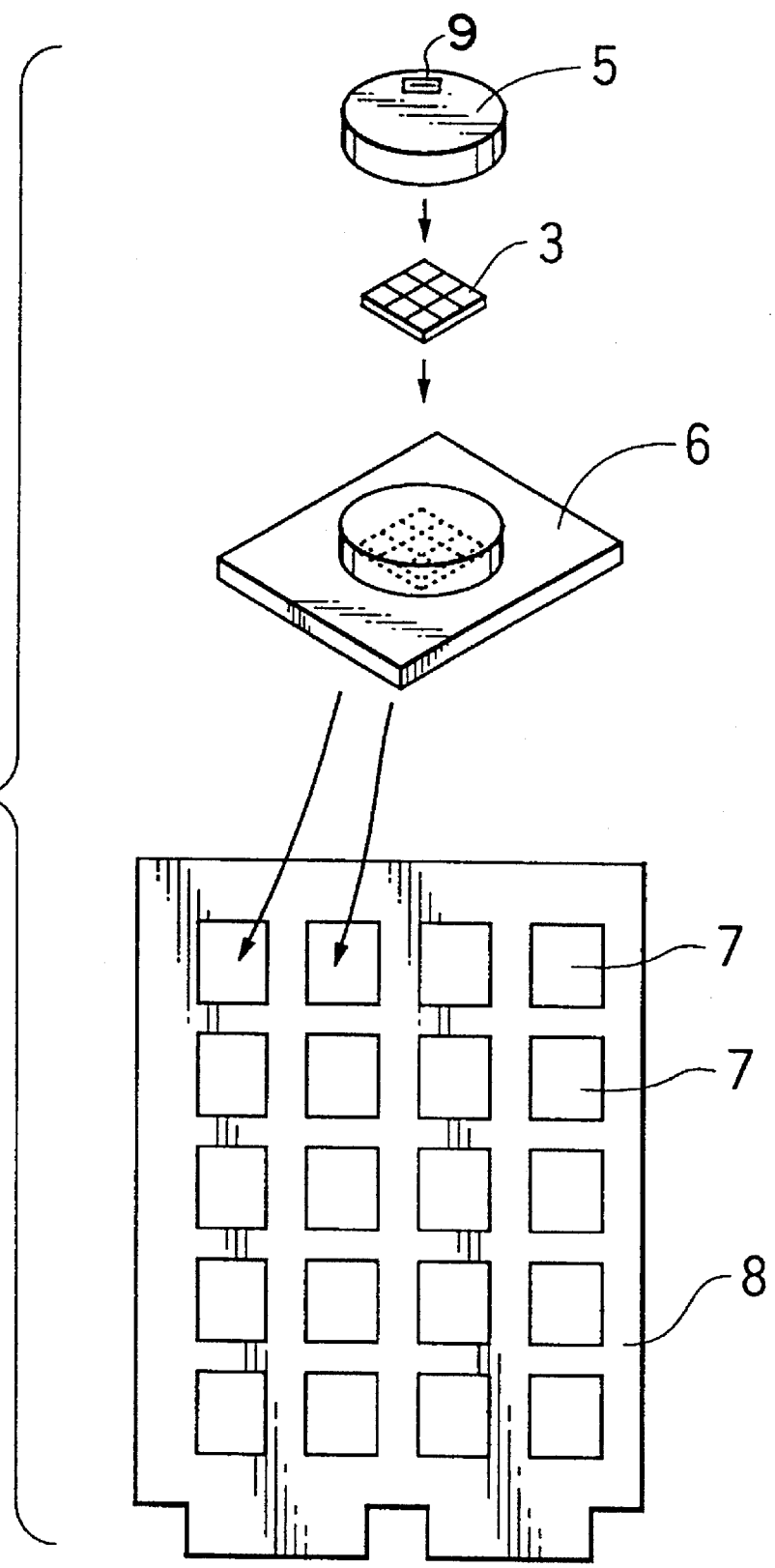
FIG. 5 shows how the sockets and carriers of the burn-in board are related relative to blocks to be tested.

Referring to FIG. 5, a burn-in board which is used in carrying out the burn-in and test according to the present invention is described below. FIG. 5 shows, in plane, a conventional burn-in board 8, and a carrier base 6 and a carrier cover 5 in the form of exploded, perspective view relative to a selected socket 7 in the burn-in board 8. The carrier base 6 and the carrier cover 5 together make up a carrier, and it is detachably fitted in a selected socket 7. As seen from FIG. 5, the burn-in board 8 has 20 sockets 7. As mentioned earlier, this burn-in board 8 may be a conventional one, and it is a printed contact board having a plurality of terminals (not shown) to permit each chip fitted in the socket to be connected to a burn-in test apparatus.

Each carrier base (FPC) 6 has contact bumps printed on its coating in such a pattern as all contact bumps may be put in alignment-and-contact with all pads 4A of the block 3 when put in the carrier, thus permitting application of electric signals to each dice 4. After the block 3 is put on the carrier base 6, the carrier cover 5 is applied to the carrier base 6, thereby fixing the block 3 in position. This carrier has a self-aligning capability of permitting the block 3 to take such a posture that the pads of each die may contact with the corresponding terminals of the carrier. Thus, when the carrier is fitted in a selected socket 7 in the burn-in board 8, the pads 4A of each die of the block 3 is ready to connection to the burn-in test apparatus via the sockets 7 of the burn-in board 8.

Each carrier has an identification code 9, put on its cover 5 or base 6. The identification code may be noticeable to the eye or electrically accessible or readable. Thus, the position of each die 4 in the original wafer can be determined in terms of the identification code of the carrier and the block number of the block, no matter at which processing step the carrier may be.

After all sockets 7 of the burn-in board 8 are loaded with carriers, the burn-in board 8 is put in the burn-in test apparatus.

When the required burn-in is finished, all carriers are removed from the burn-in board, and then, these carriers are fitted in the IC sockets of an IC tester for testing their characteristics. As may be understood, the block need not be removed from the carrier before completing all required treatments and tests. Thus, a plurality of dies contained in each carrier can be handled as a whole in the burn-in and test apparatus.

As may be understood, existing burn-in boards may be modified according to the present invention by being equipped with a plurality of IC sockets, say 20 IC sockets, and by forming required electric wirings to connect the socket contacts and the board terminals. Conventional softwares may be available without modification. Three burn-in boards may be required for handling a six-inch wafer.

From the results of the burn-in and test the semiconductor wafers can be analytically determined as to which parts are liable to cause what kind of defects in terms of block numbers and carrier identification codes. All data pertaining to rejected and passed integrated circuits are stored in a computer memory, and such rejected or passed integrated circuits can be located in original wafers by processing such data with the aid of a computer. Also, comparison of local qualities in the semiconductor wafer is permitted by processing such data appropriately.

Thanks to the handling of plural dies in block units required electric connections to the burn-in and test apparatus are not inhibitably complicated even if the number of integrated circuits to be formed in a single wafer should increase, and the "block-by-block" loading is much less laborious than the "die-by-die" loading as is conducted before.

The recording of data representing the position of each block, and the giving of identification numbers to all carriers facilitate the required analysis as to which part of the original wafer is liable to cause what kind of defect.

Still advantageously, the dividing of the wafer into blocks has the effect of reducing the absolute value of deviation of the contact pads of each die relative to the contact bumps of the carrier, thus reducing the adverse effect caused by the difference between the thermal expansion coefficients of the carrier contact bump and the semiconductor material.

What is claimed is:

1. A burn-in test method of a semiconductor wafer having a plurality of integrated circuits formed therein to be divided as respective bare dies, comprising the steps of:

dividing said semiconductor wafer into a plurality of blocks to be tested, each block including at least two bare dies;

assigning to each block positional information to indicate in which part of the semiconductor wafer the bare dies of each block are placed and recording the positional information;

preparing a burn-in board having a plurality of sockets to detachably hold a carrier and loading each carrier with one of said blocks to be tested;

fitting each carrier in a selected socket in the burn-in board and carrying out the burn-in test on the blocks in said burn-in board; and determining the defective part of the semiconductor wafer which includes at least one defective bare die based on the positional information assigned to the block as a result of said burn-in test.

2. A method according to claim 1, wherein the step of recording the positional information further comprises putting a visible indication on each block to be tested.

* * * * *